United States Patent
Weigel et al.

(10) Patent No.: US 7,446,055 B2
(45) Date of Patent: Nov. 4, 2008

(54) AEROSOL MISTED DEPOSITION OF LOW DIELECTRIC ORGANOSILICATE FILMS

(75) Inventors: Scott Jeffrey Weigel, Allentown, PA (US); Jean Louise Vincent, Bethlehem, PA (US); Sarah Kathryn Coulter, Allentown, PA (US); James Edward MacDougall, New Tripoli, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 336 days.

(21) Appl. No.: 11/082,991

(22) Filed: Mar. 17, 2005

(65) Prior Publication Data

US 2006/0211271 A1    Sep. 21, 2006

(51) Int. Cl.
*H01L 21/469* (2006.01)

(52) U.S. Cl. ............... 438/778; 438/758; 438/764; 438/787; 257/E21.114; 257/E21.191

(58) Field of Classification Search ........... 438/497, 438/500, 503, 764; 257/E21.104, E21.191, 257/E21.464
See application file for complete search history.

(56) References Cited

U.S. PATENT DOCUMENTS

| | | | |
|---|---|---|---|
| 5,456,945 A | 10/1995 | McMillan et al. | |
| 5,759,923 A | 6/1998 | McMillan et al. | |
| 6,116,184 A | 9/2000 | Solayappan et al. | |
| 6,231,933 B1 | 5/2001 | Grant | |
| 6,261,373 B1 | 7/2001 | Grant | |
| 6,358,559 B1 | 3/2002 | Hacker et al. | |
| 6,365,266 B1 | 4/2002 | MacDougall et al. | |
| 6,376,634 B1 | 4/2002 | Nishikawa et al. | |
| 6,406,794 B1 | 6/2002 | Shiota et al. | |
| 6,428,847 B1 | 8/2002 | Grant et al. | |
| 6,455,443 B1 | 9/2002 | Eckert et al. | |
| 6,472,076 B1 | 10/2002 | Hacker | |
| 6,576,568 B2 | 6/2003 | Mandal et al. | |
| 6,583,071 B1 | 6/2003 | Weidman et al. | |
| 6,592,980 B1 | 7/2003 | MacDougall et al. | |
| 2002/0048770 A1* | 4/2002 | Morozov et al. | 435/6 |
| 2003/0116091 A1 | 6/2003 | Grant et al. | |
| 2003/0118947 A1 | 6/2003 | Grant | |
| 2004/0087184 A1 | 5/2004 | Mandal et al. | |

FOREIGN PATENT DOCUMENTS

WO    WO 97/44818    11/1997

OTHER PUBLICATIONS

P. Mumbauer, et al, Primaxx Inc., Mist Deposition in Semiconductor Device Manufacturing, Semiconductor International, Nov. 1, 2004, 7 pages.

* cited by examiner

*Primary Examiner*—Scott B. Geyer
*Assistant Examiner*—Cheung Lee
(74) *Attorney, Agent, or Firm*—Geoffrey L. Chase

(57) ABSTRACT

This invention relates to an improvement in a deposition process for producing low dielectric films having a dielectric constant of 3, preferably <2.7 and lower. The process comprises the steps:
(a) forming a liquid precursor solution comprised of an organosilicon source containing both Si—O and Si—C bonds and solvent;
(b) generating a liquid mist of said liquid precursor solution, said mist existing as precursor solution droplets having a number average droplet diameter size of less than 0.5 μm;
(c) preferably electrically charging the liquid mist of said liquid precursor solution droplets;
(d) depositing liquid mist of said liquid precursor solution droplets onto a substrate; and,
(e) converting the thus deposited liquid mist of said liquid precursor solution droplets to a solid, low dielectric film.

6 Claims, No Drawings

AEROSOL MISTED DEPOSITION OF LOW DIELECTRIC ORGANOSILICATE FILMS

BACKGROUND OF THE INVENTION

Demands from the microelectronics industry are driving for lower dielectric constant (low k) materials for use as insulating interlayers between conductive lines and components of integrated circuits (IC) and associated electronic devices. Conductive line dimensions are being reduced in these products in order to increase the speed and memory storage capability of microelectronic devices, e.g., computer chips.

Chemical Vapor Deposition (CVD) and spin-on methodologies have been used as primary methods of forming low dielectric films, with k=1.8-3.5, in IC production. These methodologies are very different from each other requiring different chemistries, precursors, and equipment. In general, in a CVD process vaporized organosilicate precursors are delivered to a reaction chamber through a showerhead. Through the application of an energy source (plasma, thermal, etc) to the reaction chamber, the precursor is activated generating a solid film on the substrate. The deposition typically is done at low pressure (<20 torr) and at high temperature (200-400° C.). On the other hand, a spin-on process generally utilizes a precursor, i.e., polymers, organometallic, inorganic, hybrids of inorganic and organic, dispersed or dissolved in a solvent. The solution is applied to a spinning wafer at ambient temperature and pressure, and then thermally treated to remove the solvent and drive the reaction toward completion. The required deposition equipment, chemistry, and physical deposition process is very different for these two techniques.

The major advantage of the CVD technique is that it is the incumbent technology and existing toolsets can be used for subsequent generations of films. The major disadvantage of CVD is that it is difficult to form low dielectric films, particularly of the porous type, e.g., an organosilicate glass (OSG) film (k<2.7), by CVD techniques due to the volatility requirements of the precursors and the deposition conditions of the process. The major advantage of a spin-on process is the quick processing time, the ability to use non-volatile precursors in the formulation, the resulting uniformity of the film across large substrates, and the preservation of the precursor structure. The biggest disadvantages of spin-on are the requirement of a separate toolset, the low efficiency of chemical usage, and the problems associated with disposal of chemical waste.

Liquid source misted chemical deposition technology (LSMCD) is a new route to high dielectric films, such as metal oxides, ferroelectrics, superconductors, and silicon dioxide. Liquid source misted deposition utilizes a nebulizer, venturi or other means to produce mist droplets of precursor solution that are extremely fine and controlled. These mists of precursor solution are flowed through a deposition chamber and deposited onto a substrate. The solvent is driven from the deposited mist and a film is formed.

Representative patents illustrating apparatus and methods for depositing films using the liquid misted technique and patents illustrating the preparation of low dielectric films are as follows:

U.S. Pat. No. 5,456,945 discloses a method for depositing thin films of complex compounds such as metal oxides, ferroelectrics, etc. via liquid mist technology. The patentees point out that vacuum deposition, e-beam, laser ablation, CVD and liquid applications employing spin-on techniques, dipping and spraying have been used for forming such films but each posed significant disadvantages. In the liquid misted process, a precursor liquid is formed including an element, e.g., a metal-alkoxide and alcohol solvent, converted to a mist and deposited onto a substrate, e.g., a silicon wafer. During deposition UV radiation or a DC bias is applied between two parallel plates. After deposition, the solvent is removed and a bake cycle effected. Exemplary high dielectric films are of the lead zirconium titanate and barium strontium titanate type.

U.S. Pat. No. 5,759,923 discloses the fabrication of thin films of silicon dioxide and silicon glass by a liquid mist technique. In the disclosed process a precursor liquid including a silicon or silicon glass forming component, e.g., an alkoxy silane such as silicon butoxide is converted into a mist, flowed into a deposition chamber, and then the mist deposited over the surface of the substrate. Upon heating, the solvent is removed and films are formed by the application of heat or UV radiation.

U.S. Pat. No. 6,116,184 and WO 97/44818 disclose an improvement to the U.S. Pat. No. 5,456,945 liquid mist process when electric fields are used to assist in the deposition of such mists. Mists incorporating metal-organic compounds such as alkoxides and carboxylates do not ionize well making them difficult to use them in conjunction with an electric field. To solve the problem of poling (sic) of the mist, the patentees create a mist in a venturi that also ionizes the mist particles. The mist is passed through a velocity reduction chamber and showerhead type inlet plate in order to provide a uniform flow of mist to the substrate. An electrical accelerator is employed to increase the energy of the mist particles in a controlled manner so as not to break the chemical bonds that lead to high quality films. Oxygen is added to the mist to facilitate applying a charge to the mist.

US 2003/0118947 discloses the liquid source misted deposition of high dielectric films on select portions of a substrate. Select deposition is in contrast to U.S. Pat. No. 6,116,184 where the entire surface is coated. A polarized precursor mist migrates to an exposed or unexposed film portion of the substrate.

The following references describe several approaches to organosilicate glass (OSG) mixtures leading to low dielectric constant films, and methods of film deposition thereof.

U.S. Pat. Nos. 6,592,980 and 6,365,266 discloses ceramic films, particularly mesoporous films of increased porosity and low halide content, having low dielectric constants. A spinning solution containing a ceramic precursor, e.g., tetramethoxysilane, titanium isopropoxide, aluminum sec-butoxide and the like in a solvent such as a lower alkanol, an acid catalyst and a surfactant is applied to a substrate. Solvent is removed in the spinning process and, on calcination, the surfactant is removed to form a porous silica network.

U.S. Pat. No. 6,576,568 and 2004/0087184 disclose a process for depositing low dielectric porous silicon oxide-based films using a sol-gel approach. A stock precursor solution is formed which includes a soluble silicon oxide source, water, solvent, a purified nonionic surfactant, an ionic additive or amine additive and acid catalyst. The precursor solution is coated onto the substrate via spinning and after centrifugal draining the coated substrate is treated to form a hardened film.

U.S. Pat. No. 6,455,443 discloses a process for producing low dielectric films onto a substrate by applying a silane coupling agent containing a polymerizable group onto a surface of a substrate, heating the substrate to provide a surface containing Si—O bonds, rinsing the heated substrate with a solvent for removing residual silane-coupling agent and applying dielectric material to the rinsed surface containing Si—O bonds. Examples of low dielectric materials include polyarylene ethers, Si-containing polymers, e.g., organosilsesquioxanes.

U.S. Pat. No. 6,583,071 discloses a process for forming extremely low dielectric films (dielectric constants of 3 and below) via the coating of a substrate with a precursor solution comprised of a silicon oxide, solvent, surfactant, and acid catalyst using an ultrasonic spray nozzle. The components of the precursor solution are combined immediately prior to coating and the ultrasonic spray coating apparatus is scanned across the surface of a spinning substrate. A Sonotek Ultrasonic Atomizing Nozzle 8700-120MS is used to generate precursor solution droplets (median drop diameter ~13-18 microns). The solvent and surfactant are removed on application of heat and a solid, porous low dielectric film is formed.

BRIEF SUMMARY OF THE INVENTION

This invention relates to an improvement in a process for producing low dielectric films having a dielectric constant of 3, preferably <2.7, and lower. The improved process comprises the steps:
(a) providing a liquid mist of a liquid precursor solution comprised of an organosilane precursor containing both Si—O and Si—C bonds and solvent, said mist existing as droplets having a number average droplet diameter size of less than 0.5 μm, preferably less than 0.3 μm;
(b) depositing the liquid mist of said liquid precursor solution droplets onto a substrate; and,
(c) converting the thus deposited liquid mist of said liquid precursor solution droplets to a solid, low dielectric film.

In a preferred embodiment involving the application of liquid mist deposition technology to the formation of low dielectric films, the liquid mist of said liquid precursor solution droplets generated in step (b) is electrically charged and the electrically charged liquid mist of said liquid precursor solution droplets is deposited onto an electrically biased substrate. Then, the thus deposited liquid mist of said liquid precursor solution droplets is converted to a solid, low dielectric film.

Significant advantages can be achieved by the liquid source misted deposition process in the formation of low dielectric films and they include:
an ability to form high quality low dielectric films on a substrate at ambient temperatures;
an ability to maintain the precursor functionality and structure in the deposition process;
an ability to employ a wide range of chemical precursors;
an ability to prepare highly uniform coatings on large substrates (thickness and composition); and,
an ability to form films of low dielectric materials on substrates having nonuniform surface contours.

DETAILED DESCRIPTION OF THE INVENTION

The invention relates to an improved process for producing thin films having a low dielectric constant, typically an organosilicate glass (OSG), for use in the microelectronics industry as an insulating component of an integrated circuit. The films can be porous or they can be dense organosilicate glass films which have dielectric constants of 3 or less, preferably 2.7 or less. An improvement in the process for forming these films from low dielectric liquid precursor solutions resides in a coating method referred to as liquid source misted chemical deposition (LSMCD) and the use of organosilicate glass precursor formulations in the deposition process.

In this technique, low dielectric precursor components are dissolved in a solvent and converted into an aerosol mist via a nebulizer having very finely controlled droplet size. These mists, it is believed, are in the form of colloidal suspensions where the number average precursor solution droplet size is not more than about 0.5 microns and generally not more than 0.3 microns. This mist preferably is electrically charged by passing the droplets through an electric field and the charged mist is delivered to a reaction chamber through a showerhead. The mist is contacted with a biased substrate and then, the substrate is heated to drive off the solvent and drive the reaction toward completion. A film containing Si—O and Si—C bonds is formed, thus maintaining the functionality and structure of the organosilane precursor. One can omit electrically charging mist but the process may suffer from a reduced deposition rate. Specific examples of the liquid misted deposition processes are found in U.S. Pat. Nos. 5,456, 945; 6,116,184, and published US application 2003/0116091, the subject matter in each reference being incorporated by reference.

One type of low dielectric liquid precursor solution suited for liquid source misted deposition described above is of the type to produce a porous film. These liquid precursor solutions are comprised of a soluble silicon oxide source containing both Si—O and Si—C bonds, i.e., an organosilane, optionally along with a soluble silicate network forming precursor, a surfactant, a solvent, water, and an acid catalyst. The choice of each component, and the stoichiometry of each component in the liquid precursor solution, allows for the achievement of suitable deposition rates and the generation of films having low dielectric constants and high mechanical properties by the liquid misted deposition technology.

The organosilane precursors suited for use in forming the liquid precursor solutions are soluble silicon oxide sources containing from one to three Si—C bonds, and also one to three reactive groups, such as hydroxides, alkoxides, halides, or acetates, such that the total amount of groups bonded to the silicon atom is four. Preferably, the precursor is one where the silicon is bonded only to one or two carbon atoms with the balance of bonds being Si—O bonds. The organic groups providing for at least one Si—C linkage can be in the form of an alkyl group, a substituted alkyl group, an aryl group, or a substituted aryl group, and they are bonded directly to a silicon atom through at least one Si—C bond. Examples of suitable organosilane precursors include methyltriethoxysilane, methyltriacetoxysilane, phenyltrimethoxysilane, ethyltriethoxysilane, dimethyldiethoxysilane, dimethyldimethoxysilane, methyltrichlorosilane, and methyltrihydroxysilane. The organosilane precursors may also take the form of a substituted linear or cyclic siloxane, such as octamethyltetrasiloxane or methylpentamethoxydisiloxane. The organosilane precursor can also be a hydridosilane, such as diethoxymethylsilane or tetramethylcyclosiloxane. Mixtures of several organosilane precursors can also be used.

Other soluble silicate precursors, i.e., network forming precursors, can be used in combination with the organosilane precursor to influence film properties. They are of the type which possesses no Si—C bonds. These soluble silicate network forming precursors typically have four Si—OR bonds, where the OR group is a reactive alkoxide, hydroxide, or acetate. Examples of suitable soluble silicate network forming precursors include tetraethylorthosilicate (TEOS), tetrabutoxysilane, tetraacetoxysilane, and dimethoxydiacetoxysilane.

The soluble silicate network forming precursors, which may be used with the organosilane precursor, may also be in the form of a reactive compound that does not have Si—O bonds but ones that do produce Si—O bonds in the presence of water. Further, though, they should be of the type that does not generate Si—C bonds. An example of such a precursor is silicon tetrachloride.

The liquid precursor solution can also include additives that will add functionality into the organosilicate film. These additives include compounds containing C—F bonds such as trifluoropropyltriethoxysilane, unsaturated organic compounds such as alkenes, alkynes, or dienes, and bridged organosilanes such as bis(triethoxysilyl)ethane.

Other types of liquid precursor solutions and films prepared from the liquid precursor solutions are described in U.S. Pat. Nos. 6,376,634 and 6,406,794 and, the subject matter therein is incorporated by reference. Liquid precursor solutions are comprised of at least one organosilane compound containing Si—C bonds as in $R_2R_3Si(OR_1)_2$ and $R_2Si(OR_1)_3$ in combination with a soluble silicate network forming precursor of the formula $Si(OR_1)_4$.

Low dielectric films can also be formed from organosilsesquioxanes. They are of the formula $[R—SiO_{1.5}]_x[H—SiO_{1.5}]_y$ and the sum of x and y is an integer between 2 and 30. Inclusion of alkylene moieties in the precursor facilitates the formation of porous low dielectric films. U.S. Pat. No. 6,472,076 discloses such low dielectric films and the subject matter is incorporated by reference.

In the design of these kinds of low dielectric films, the dielectric constant and modulus of the films is affected by the level of Si—O—Si linkages and by those Si atoms which are substituted by one or more organic groups. Thus, the ratio of the organosilane precursor to soluble silicate network forming precursor in the liquid precursor solution can be used to determine the amount of Si atoms substituted with organic groups in the final film. For example, a formulation that has a 50/50 ratio of methyltrimethoxysilane tetraethoxysilane will have about half of the Si atoms substituted with a methyl group. Although it is not necessary to include a soluble silicate network forming precursor in the liquid precursor solution, generally the molar ratio of organosilane precursor to soluble silicate network forming precursor will be between 0.01 to 20:1. The preferred weight percent of the organosilane precursor and soluble silicate network forming precursor, if employed, in the liquid precursor solution (the level of organosilane and organosilicate are used for solids determination) in the final liquid precursor solution will be between 10 and 60 wt %, generally between 15 and 50 wt %.

The LSMCD precursor formulations further comprise a solvent for the components in the liquid precursor solution. The solvent vapor pressure, polarity and density can influence the deposition of the precursor solution dramatically. The solvent should be one that is miscible with all of the other components in the formulation. Otherwise, phase separation in the formulation can occur. The solvent should be volatile enough to be removed quickly after the deposition and during the bake steps for producing a hardened film. However, the solvent should also be sufficiently non-volatile such that it doesn't vaporize at the nebulizer since this would produce either a clogged nebulizer or powder on the surface of the substrate. One of the advantages of the liquid misted process is that a wide variety of solvents may be used which are not only compatible with the precursors employed but compatible with conventional process conditions. Typically, the boiling point of the solvent for the low dielectric precursor solution for use in the liquid misted process is from 78 to 250° C. at atmospheric pressure.

Examples of solvents which can be used in the process comprise: alcohol, glycol, glycol ether, glycol ether ester, or protic solvent. The following solvents are given as examples:
  alcohol solvents: monohydric alcohols such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, and n-hexanol;
  polyhydric alcohols such as ethylene glycol, 1,2-polyethylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, and tripropylene glycol;
  polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, and dipropylene glycol monomethyl ether; and,
  ester solvents such as diethyl carbonate, ethylene carbonate, propylene carbonate, diethyl carbonate, methyl acetate, ethyl acetate, gamma.-butyrolactone, gamma.-valerolactone, n-propyl acetate, i-propyl acetate, n-butyl acetate, i-butyl acetate, sec-butyl acetate, n-pentyl acetate, sec-pentyl acetate, benzyl acetate, cyclohexyl acetate, methylcyclohexyl acetate, n-nonyl acetate, and ethylene glycol monoethyl ether acetate.

The liquid precursor solution may further comprise a catalyst and, sometimes water. The catalysts may be acids or bases and they can be essential to ensure that hydrolysis of the precursors occurs and that the network-forming reactions (reactions that form Si—O—Si linkages) are driven toward completion. The reactions include hydrolysis of Si—OR and Si—Cl bonds to form Si—OH bonds, and the dehydration of Si—OH groups to form Si—O—Si linkages. Typical acid catalysts include aqueous nitric, hydrochloric, hydrofluoric, sulfuric, and carboxylic acids. Examples of suitable base catalysts include-tetramethylammonium hydroxide and ammonium hydroxide. The acid catalyst also may be generated in situ by halogenated silanes, such as chlorosilanes.

The liquid precursor solution may be prepared in advance, or in stages, and optionally aged for several hours to several days before deposition. The pre-deposition reaction allows for the formation of some Si—O—Si bonds, but not to the extent that the silicate precipitates from the solution. The pre-deposition aging may take place before or after the catalyst is added.

The liquid precursor solution often comprises a porogen. A porogen is a species that is incorporated in the film and then removed from the film, e.g., volatized or decomposed, by applying an energy source (thermal, e-beam, IR, UV). To facilitate removal of the porogen, a vacuum may be applied. A void is generated in the film with the removal of the volatilized porogen from the film. Suitable porogens for the low dielectric film precursor formulations comprise surfactants, decomposable organic polymers, and dendrimers.

Surfactants in the liquid precursor solution can act as porogens, leading to the formation of voids, and/or aid in the dispersibility of the components in the liquid precursor solutions. Some examples comprise: tri-block copolymers, di-block co-polymers, ethoxylated or propoxylated alcohols, ethoxylated or propoxylated alkylphenols, and ethoxylated or propoxylated acetylenic diols. An example of a suitable surfactant is Triton X-114. The concentration of the surfactant in the liquid precursor solution generally is between 0 and 10 weight per cent.

One goal of the interlayer dielectric application requires a deposition rate of at least 10 angstroms/second for a film having a dielectric constant of 3 or less and preferably a deposition rate of at least 30-50 angstroms/second. The desired thickness of the low dielectric films, particularly of the organosilicate glass (OSG) type films ranges between 0.1 to 1 micron.

Organosilicate glass films of the type generated from the above liquid precursor solutions typically have dielectric constants of 3 or less and are of particular interest for interlayer dielectric applications. Such films can be produced from the liquid precursor solution using the liquid misted deposition method.

The following examples are provided to illustrate various embodiments of the invention and are not intended to restrict the scope thereof.

EXAMPLE 1

Preparation of a Liquid Precursor Solution for Liquid Misted Deposition (25 wt % Solids)

The reagents were added to a clean PTFE container in the following order: 22.5 g tetraethylorthosilicate (TEOS), 22.5 g methyltriethoxysilane (MTES), 100 g propyleneglycol propyl ether (PGPE), and 9.67 g of octylphenol polyethyleneglycol ether sold under the trademark, Triton X-114, which was purified to remove alkali metal contaminants. This solution was agitated for 2-3 minutes. In a separate PTFE bottle, a catalyst solution of 24 g of 0.1 M $HNO_3$ and 1 g 2.4 wt % tetramethylammonium hydroxide (TMAH), i.e., the catalyst components were combined. The catalyst solution was added to the silicate containing solution and shaken for 4-5 minutes to prepare a homogeneous clear solution. The solution then was filtered through a 0.2 micron Teflon filter.

EXAMPLE 2

Preparation of a Liquid Precursor Solution for Liquid Misted Deposition-Reduced Solvent (36 wt % Solids)

The precursor solution formulation was similar to that of Example 1 except the solvent concentration was reduced thereby increasing the solids content of the precursor solution. The reagents were added to a clean PTFE container in the following order: 22.5 g tetraethylorthosilicate (TEOS), 22.5 g methyltriethoxysilane (MTES), 47 g propyleneglycol propyl ether (PGPE), and 9.67g of Triton X-114. This solution was agitated for 2-3 minutes. In a separate PTFE bottle, a catalyst solution of 24 g of 0.1 M $HNO_3$ and 1 g 2.4 wt % tetramethylammonium hydroxide (TMAH), i.e., catalysts, were combined together. The catalyst solution was added to the silicate solution and shaken for 4-5 minutes to prepare a homogeneous clear solution. The solution was then filtered through a 0.2 micron Teflon filter.

EXAMPLE 3

Preparation of a Liquid Precursor Solution for Liquid Misted Deposition—Different Solvent (25% Solids)

The procedure of Example 1 was followed except a different solvent was used in preparing the precursor solution. In this example, the reagents were added to a clean PTFE container in the following order: 22.5 g tetraethylorthosilicate (TEOS), 22.5 g methyltriethoxysilane (MTES), 100 g of 1-propanol, and 9.67g of Triton X-114. This solution was agitated for 2-3 minutes. In a separate PTFE bottle, a catalyst solution of 24 g of 0.1 M $HNO_3$ and 1 g 2.4 wt % tetramethylammonium hydroxide (TMAH), i.e., catalysts, were combined. The catalyst solution was added to the silicate solution and shaken for 4-5 minutes to prepare a homogeneous clear solution. The solution was then filtered through a 0.2 micron Teflon filter.

EXAMPLE 4

Preparation of a Liquid Precursor Solution for Liquid Misted Deposition—Different Porogen (25% Solids)

The procedure of Example 1 was followed except a different porogen was used in the formulation. The reagents were added to a clean PTFE container in the following order: 22.5 g tetraethylorthosilicate (TEOS), 22.5 g methyltriethoxysilane (MTES), 100 g propyleneglycol propyl ether (PGPE) and 7.5 g of a difunctional block copolymer terminating in primary hydroxyl groups, i.e., Pluronic L101. This solution was agitated for 2-3 minutes. In a separate PTFE bottle, a catalyst solution of 24 g of 0.1 M $HNO_3$ and 1 g 2.4 wt % tetramethylammonium hydroxide (TMAH), i.e., the catalysts, were combined. The catalyst solution was added to the silicate solution and shaken for 4-5 minutes to prepare a homogeneous clear solution. The solution then was filtered through a 0.2 micron Teflon filter.

EXAMPLE 5

Preparation of a Liquid Precursor Solution for Liquid Misted Deposition—Acetoxy Silicate Species The procedure of Example 1 was followed except a different hydrolysable silicate species was used in order to minimize the amount of hydroxyls on the resultant film formed with the intent of increasing the mechanical properties of the film.

A stock solution of tetraacetoxysilane (TAS) is prepared by mixing 40 g of 1-propanol, 12.5 g of deionized water, and 22.5 g of TAS. This solution is shaken for 1 hour followed by 24 hours of ambient aging. To the TAS solution 23 g of methyltriacetoxysilane (MTAS), 7.2 g 0.025 M $HNO_3$, 10.2 g 1-propanol, 10.2 g Tergitol 15-S-5, and 1.4 g of 1.2 wt % TMAH are added. The solution is agitated for approximately 5 minutes. This final solution is aged overnight, filtered through a 0.2 μm Teflon filter.

EXAMPLE 6

Liquid Misted Deposition of a Liquid Precursor Solution for Forming a Low Dielectric Organosilicate Glass Film A low dielectric constant porous organosilicate glass film is formed on a 200 mm substrate by the liquid misted deposition of the liquid precursor solution of Example 1 using a Primaxx (of Allentown, Pa.) LSMCD tool. The liquid precursor solution is passed through a nebulizer generating a number average droplet size of less than 0.35 µm. The processing conditions are listed below.

Misted Deposition Liquid Precursor Solution flow rate of 1 g/min
Chamber pressure 760 torr
Substrate temperature 25° C.
Process Gas nitrogen
Applied voltage to mist 8 kV
Deposition time 10 minutes for a 5000 angstrom film The deposited film is then cured on hot plates in air at 760 torr at 90° C. for 90 seconds, 140-180° C. for 90 seconds, and 400° C. for 180 seconds. The resulting film has a dielectric constant of 2.4-2.5, a Young's modulus of 1.9-5 GPa, and a thickness of approximately 5000 Å.

Surprisingly, the above example shows that a low dielectric insulating film can be prepared from a liquid precursor solution that is not metal containing by the liquid mist deposition method. The example is also in contrast to liquid mist deposition processes of the prior art where only metal containing precursor solutions had been employed for forming high dielectric films. The example is also in contrast to the prior art where CVD or spin-on technology had been used to form such low dielectric films. Plugging of the nebulizer does not occur even though catalyzed solutions of extremely fine droplets are introduced to the reaction chamber. It is also surprising that a sufficient electrical charge can be imposed on the droplets thereby enhancing migration to the substrate.

EXAMPLE 7

Effect of Increased Solids on Deposition Rate

The purpose of this example is to demonstrate if one can increase the deposition rate for producing low dielectric constant porous organosilicate glass film by the liquid mist technique using a liquid precursor solution having a reduced solvent concentration to that of Example 1. The procedure of Example 6 is followed. A film is deposited on a 200 mm substrate using the misted deposition precursor solution of Example 2 in a Primaxx LSMCD tool. The processing conditions are listed below.

Misted Deposition Liquid Precursor Solution flow of 1 g/min
Chamber pressure 760 torr
Substrate temperature 25° C.
Process Gas nitrogen
Applied voltage to mist 8 kV
Deposition time 5 minutes The deposited film is then cured on hot plates in air at 760 torr at 90° C. for 90 seconds, 140-180° C. for 90 seconds, and 400° C. for 180 seconds resulting in a low dielectric constant film. A film of similar thickness to that of Example 6 is generated in one-half the deposition time. Thus, as the concentration of organosilane precursor/soluble silicate network forming precursor is increased in the liquid precursor solution, the deposition rate can be increased. From the results, it is thought the preferred concentration range to achieve high deposition rates is 15-60% by weight of the total formulation.

EXAMPLE 8

Effect of Lower Chamber Pressure on Deposition Rate

The purpose of this example is to determine if the deposition rate can be enhanced by decreasing the chamber pressure to that of Example 6. It is thought that if the pressure in the chamber is decreased below atmospheric pressure one can increase the driving forces for the droplets to accelerate to the surface of the substrate and thereby increase the deposition rate of the film.

The procedure of Example 6 is followed. A low dielectric constant porous organosilicate glass film is deposited on a 200 mm substrate from the liquid precursor solution of Example 1 using a Primaxx LSMCD tool. The chamber pressure is 300 torr or about one-half that of Example 6.

Misted Deposition Liquid Precursor Solution flow of 10 g/min
Chamber pressure 300 torr
Substrate temperature 25° C.
Process Gas nitrogen
Applied voltage to mist 8 kV
Deposition time 5 minutes The deposited film is then cured on hot plates in air at 760 torr at 90°C. for 90 seconds, 140-180° C. for 90 seconds, and 400° C. for 180 seconds resulting in a low dielectric constant film. A film of similar thickness to that of Example 6 is prepared in about 5 minutes deposition time vs. 10 minutes for the conditions of Example 6.

EXAMPLE 9

Effect of Precursor Flow Rate on Deposition Rate

The purpose of this example is to determine whether the deposition rate to that of Example 6 can be enhanced by increasing the liquid precursor solution flow rate.

A low dielectric constant porous organosilicate glass film is formed on a 200 mm substrate from the liquid precursor solution of Example 1 using a Primaxx LSMCD tool. The processing conditions are listed below.

Misted Deposition Liquid Precursor Solution flow of 10 g/min Chamber pressure 760 torr
Substrate temperature 25° C.
Process Gas nitrogen
Applied voltage to mist 8 kV
Deposition time 5 minutes The deposited film is then cured on hot plates in air at 760 torr at 90° C. for 90 seconds, 140-180° C. for 90 seconds, and 400° C. for 180 seconds resulting in a low dielectric constant film. Although the liquid precursor solution flow rate is increased by a factor of 10, the deposition rate does not increase in direct proportion to the flow rate.

EXAMPLE 10

Effect of Lower Substrate Temperature on Deposition Rate

The purpose of this example is to determine the effect of substrate temperature on the deposition rate of the liquid precursor solution to that of Example 6.

A low dielectric constant porous organosilicate glass film is formed on a 200 mm substrate from the liquid precursor solution of Example 1 using a Primaxx LSMCD tool. The processing conditions are listed below.

Misted Deposition Liquid Precursor Solution flow of 1 g/min
Chamber pressure 760 torr
Substrate temperature 0° C.
Process Gas nitrogen
Applied voltage to mist 8 kV
Deposition time 5 minutes The deposited film is then cured on hot plates in air at 760 torr at 90° C. for 90 seconds, 140-180° C. for 90 seconds, and 400° C. for 180 seconds resulting in a low dielectric constant film. A film having a thickness greater than the thickness of the film of Example 6 is produced. Thus, the results show that lowering the substrate temperature can increase the deposition rates of the nebulized precursor solution. Coupling lower substrate temperatures with the biases applied causes additional attraction of the liquid precursor droplets and more efficient use of the liquid precursor solution.

EXAMPLE 11

Effect of Increased Applied Voltage on The Deposition Rate

The purpose of this example is to determine the effect of applied voltage on the deposition rate to that of Example 6.

A low dielectric constant porous organosilicate glass film is deposited on a 200 mm substrate from the liquid precursor solution of Example 1 using a Primaxx LSMCD tool. The processing conditions are listed below.

Misted Deposition Liquid Precursor Solution flow of 1 g/min
Chamber pressure 760 torr
Substrate temperature 25° C.
Process Gas nitrogen
Applied voltage to mist 20 kV (typically ranges between 4 and 100 kV)
Deposition time 5 minutes The deposited film is then cured on hot plates in air at 760 torr at 90° C. for 90 seconds, 140-180° C. for 90 seconds, and 400° C. for 180 seconds resulting in a low dielectric constant film.

The applied voltage has a direct effect on the deposition rate of the OSG film. As the voltage is increased, the deposition rate is increased; however, the correlation is not linear and the gain in deposition rate drops off as the thickness of the deposited film is increased. The preferable range for applied voltage in the liquid misted deposition employed here is from 6-16 kV.

Summarizing the examples, it has been shown that high quality low dielectric films can be prepared from organosilane containing liquid precursor solutions by liquid misted deposition. Nebulizing the liquid precursor solution and electrically charging the thus formed droplets, provides a method for attracting the charged droplets to a biased substrate. The examples also illustrate that a wide variety of silicate precursors, solvents, and porogens can be used for the formation of highly uniform organosilicate films using the LSMCD process.

The largest impact on the deposition rate appears to be related to the solids content of the liquid precursor solution. By increasing the solids content from 25% to 45% the deposition may easily increase ten times.

Tool processing parameters can have an effect on the deposition rate. By implementing an increase in the chamber pressure, increasing the bias between the droplets and the substrate, increasing the liquid precursor solution flow rates, and lowering the substrate temperature one can influence the deposition.

The invention claimed is:

1. A liquid source misted deposition process capable of producing a solid, low dielectric film on a substrate which comprises the steps:
   (a) providing a liquid mist of a liquid precursor solution comprised of a low dielectric organosilane source containing both Si—O and Si—C bonds and a solvent, said liquid mist existing as precursor solution droplets having a number average droplet diameter size of less than 0.5 µm and suited for deposition in said liquid source misted deposition process;
   (b) electrically charging said precursor solution droplets to form a liquid mist of electrically charged precursor solution droplets;
   (c) depositing said electrically charged precursor solution droplets onto an electrically charged substrate of opposite bias and forming a film of precursor solution droplets on said substrate; and,
   (d) converting said film of precursor solution droplets to a solid low dielectric film on said substrate for use in the microelectronics industry as an insulating component.

2. The process of claim 1 wherein a soluble silicate network forming precursor is included in the liquid precursor solution and said soluble silicate network forming precursor has four Si—OR bonds and the OR group is a reactive alkoxide, hydroxide, or acetate.

3. The process of claim 1 wherein the liquid precursor solution has a molar ratio of said organosilane to soluble silicate network forming precursor ranging from 0.01 to 20:1.

4. The process of claim 3 wherein the organosilane is selected from the group consisting of methyltriethoxysilane, methyltriacetoxysilane, phenyltrimethoxysilane, ethyltriethoxysilane, dimethyldiethoxysilane, dimethyldimethoxysilane, methyltrichlorosilane, methyltrihydroxysilane, octamethyltetrasiloxane, methylpentamethoxydisiloxane, diethoxymethylsilane and tetramethylcyclosiloxane.

5. The process of claim 3 wherein the soluble silicate network forming precursors are selected from the group consisting of tetraethylorthosilicate, tetrabutoxysilane, tetraacetoxysilane, and dimethoxydiacetoxysilane.

6. The process of claim 1 wherein the film is formed at a deposition rate of 30 to 50 angstroms/second.

* * * * *